US010497722B2

(12) United States Patent
Shen

(10) Patent No.: US 10,497,722 B2
(45) Date of Patent: Dec. 3, 2019

(54) ARRAY SUBSTRATE AND MANUFACTURING METHOD THEREOF, AND LIQUID CRYSTAL DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Qiyu Shen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 579 days.

(21) Appl. No.: 14/499,728

(22) Filed: Sep. 29, 2014

(65) Prior Publication Data

US 2015/0364504 A1 Dec. 17, 2015

(30) Foreign Application Priority Data

Jun. 16, 2014 (CN) .......................... 2014 1 0268282

(51) Int. Cl.
*G02F 1/1362* (2006.01)
*H01L 27/12* (2006.01)
(Continued)

(52) U.S. Cl.
CPC .... *H01L 27/1248* (2013.01); *G02F 1/133512* (2013.01); *G02F 1/134363* (2013.01);
(Continued)

(58) Field of Classification Search
None
See application file for complete search history.

(56) References Cited

U.S. PATENT DOCUMENTS 6,462,800 B1 10/2002 Kim et al.
2001/0013915 A1* 8/2001 Song ................. G02F 1/134363
349/141
(Continued)

FOREIGN PATENT DOCUMENTS

CN 1945838 A 4/2007
CN 102053439 A * 5/2011 ....... G02F 1/136213
(Continued)

OTHER PUBLICATIONS

1st office action issued in corresponding Chinese application No. 201410268282.3 dated Apr. 5, 2016.

*Primary Examiner* — Edward J Glick
*Assistant Examiner* — Mark D Teets
(74) *Attorney, Agent, or Firm* — Nath, Goldberg & Meyer; Joshua B. Goldberg

(57) ABSTRACT

The present invention discloses an array substrate and a manufacturing method thereof, and a liquid crystal display device, which relate to the field of liquid crystal display technology and may keep patterns at the slit tail ends of slit electrodes consistent with predesigned patterns so as to avoid a trace mura phenomenon. The array substrate includes a plurality of sub-pixel units defined by crossing of a plurality of gate lines and a plurality of data lines, wherein a first electrode is arranged in each sub-pixel unit, the first electrode is a slit electrode, and a common electrode line is arranged below the first electrode. In each sub-pixel unit, a light blocking layer is arranged between the common electrode line and the first electrode, and both the slit tail end of the first electrode and the common electrode line are positioned in the area of the light blocking layer.

12 Claims, 4 Drawing Sheets

(51) Int. Cl.
*G02F 1/1335* (2006.01)
*G02F 1/1343* (2006.01)

(52) U.S. Cl.
CPC ...... *G02F 1/136209* (2013.01); *H01L 27/124* (2013.01); *H01L 27/1255* (2013.01); *H01L 27/1259* (2013.01)

(56) References Cited

U.S. PATENT DOCUMENTS

| | | |
|---|---|---|
| 2005/0122460 A1 | 6/2005 | Yokogawa et al. |
| 2007/0030432 A1 | 2/2007 | Chen et al. |
| 2011/0309397 A1* | 12/2011 | Cheng ............... G02F 1/136209 257/98 |
| 2012/0218501 A1* | 8/2012 | Lee ................... G02F 1/134309 349/139 |
| 2015/0146143 A1* | 5/2015 | Kim .................. G02F 1/133512 349/104 |

FOREIGN PATENT DOCUMENTS

| | | |
|---|---|---|
| CN | 103489824 A | 1/2014 |
| CN | 103700628 A | 4/2014 |

* cited by examiner

ARRAY SUBSTRATE AND MANUFACTURING METHOD THEREOF, AND LIQUID CRYSTAL DISPLAY DEVICE

FIELD OF THE INVENTION

The present invention relates to the field of liquid crystal display technology, and in particular relates to an array substrate and a manufacturing method thereof, and a liquid crystal display device.

BACKGROUND OF THE INVENTION

An advanced-super dimensional switching (ADS for short) mode is a core technology for a plane electric field and wide viewing angle display. Specifically, an electric field generated at the edges of a slit electrode in the same plane and an electric field generated between the slit electrode and a plate electrode form a multi-dimensional electric field, so that all oriented liquid crystal molecules positioned among slits of the slit electrodes and right above the electrodes in a liquid crystal cell may deflect, and the image quality of liquid crystal display is improved.

In a high-resolution display device adopting the ADS mode, because the unit area of a sub-pixel is relatively small, the storage capacitance is insufficient. Therefore, in the prior art, common electrode lines need to be manufactured on a gate layer to increase the storage capacitance. However, the design of the effective area of the common electrode lines is limited due to the limitation of resolution of exposure equipment. Meanwhile, as shown in FIG. 1, FIG. 2 and FIG. 3, the common electrode lines 1 are positioned nearby the tail ends of slits 21 of first electrodes 2 (slit electrodes) and are light-tight, whereas parts of substrate nearby the common electrode lines 1 are light-transmissible, two sides at the edges of the common electrode lines 1 are in a light blocking state and a light-transmitting state respectively in the manufacturing process of the slit electrodes, and the two states would produce different influence on light in the photoetching process, so that the thickness of a photoresist therein is non-uniform after photoetching, then patterns therein are deformed in the subsequent etching processes, the patterns at the tail ends of the slits 21 of the slit electrodes deviate from the predesigned patterns, the liquid crystal molecules therein deflect undesirably, a trace mura phenomenon is produced, and the quality of displayed images is affected.

SUMMARY OF THE INVENTION

For solving the above-mentioned problems, the present invention provides an array substrate and a manufacturing method thereof, for keeping patterns at the tail ends of slits of slit electrodes consistent with predesigned patterns so as to avoid a trace mura phenomenon. The present invention further provides a liquid crystal display device including the array substrate.

According to the first aspect of the present invention, provided is an array substrate, including a plurality of sub-pixel units defined by crossing of a plurality of gate lines and a plurality of data lines, wherein a first electrode is arranged in each sub-pixel unit, the first electrode is a slit electrode, and a common electrode line is arranged below the first electrode, wherein in each sub-pixel unit, a light blocking layer is arranged between the common electrode line and the first electrode, and both the tail ends (slit tail ends of the first electrode for short in the context) of slits of the first electrode close to the common electrode and the common electrode line are positioned in the area of the light blocking layer.

Specifically, in each sub-pixel unit, a second electrode is arranged between the first electrode and the common electrode line;

the light blocking layer is arranged between the common electrode line and the second electrode;

the first electrode is a common electrode, and the second electrode is a pixel electrode;

the light blocking layer is made of a conductive material and connected to the common electrode line.

Specifically, a first insulating layer is arranged between the light blocking layer and the common electrode line, wherein in the first insulating layer, an insulating layer through hole is arranged in a part of the light blocking layer superposing with the common electrode line, and the light blocking layer is connected to the common electrode line via the insulating layer through hole.

Specifically, a second insulating layer is arranged between the light blocking layer and the second electrode; and a third insulating layer is arranged between the second electrode and the first electrode.

According to the second aspect of the present invention, provided is a liquid crystal display device, including the array substrate according to the first aspect of the present invention.

According to the third aspect of the present invention, provided is a manufacturing method of an array substrate, including the following steps:

forming a common electrode line on a substrate;

forming a light blocking layer on the substrate including the common electrode line;

forming a first electrode on the substrate including the light blocking layer, wherein the first electrode is a slit electrode, and in each sub-pixel unit, both the slit tail end of the first electrode and the common electrode line are positioned in the area of the light blocking layer.

Specifically, the step of forming the light blocking layer on the substrate including the common electrode line includes:

forming the light blocking layer made of a conductive material on the substrate including the common electrode line, wherein the light blocking layer is connected to the common electrode line;

before the step of forming the first electrode on the substrate including the light blocking layer, the method may further include:

forming a second electrode on the substrate including the light blocking layer, wherein the second electrode is a pixel electrode.

Specifically, before the step of forming the light blocking layer on the substrate including the common electrode line, the method may further include:

forming a first insulating layer on the substrate where the common electrode line is formed, wherein in the first insulating layer, an insulating layer through hole is arranged in a part of the light blocking layer superposing with the common electrode line and used for connecting the light blocking layer with the common electrode line.

Specifically, before the step of forming the second electrode on the substrate including the light blocking layer, the method may further include:

forming a second insulating layer on the substrate including the light blocking layer; and before the step of forming the first electrode on the substrate including the light blocking layer, the method may further include:

forming a third insulating layer on the substrate including the second electrode.

According to the array substrate and the manufacturing method thereof, and the liquid crystal display device provided by the present invention, the light blocking layer is arranged in the array substrate, so that before the slit electrodes are manufactured, positions where the common electrode lines and the slit tail ends of the slit electrodes are to be located are positioned in the area of the light blocking layer, and all light is blocked in the area of the light blocking layer. Therefore, in the manufacturing process of the slit electrodes, positions nearby the slit tail ends of the slit electrodes are in a light blocking state, so that the thicknesses of photoresist therein are consistent after photoetching, patterns at the slit tail ends of the slit electrodes are consistent with predesigned patterns, and a trace mura phenomenon is avoided.

BRIEF DESCRIPTION OF THE DRAWINGS

To illustrate technical solutions in the embodiments of the present invention or in the prior art more clearly, a brief introduction on the accompanying drawings which are needed in the description of the embodiments or the prior art is given below. Apparently, the accompanying drawings in the description below are merely some of the embodiments of the present invention, based on which other drawings may be obtained by ordinary person skilled in the art without any creative effort.

DETAILED DESCRIPTION OF THE EMBODIMENTS

A clear and complete description of technical solutions of the embodiments of the present invention will be given below in combination with the accompanying drawings in the embodiments of the present invention. Apparently, the embodiments described below are merely a part, but not all, of the embodiments of the present invention. All of other embodiments, obtained by a person skilled in the art based on the embodiments of the present invention without any inventive efforts, fall into the protection scope of the present invention.

Figure 1:
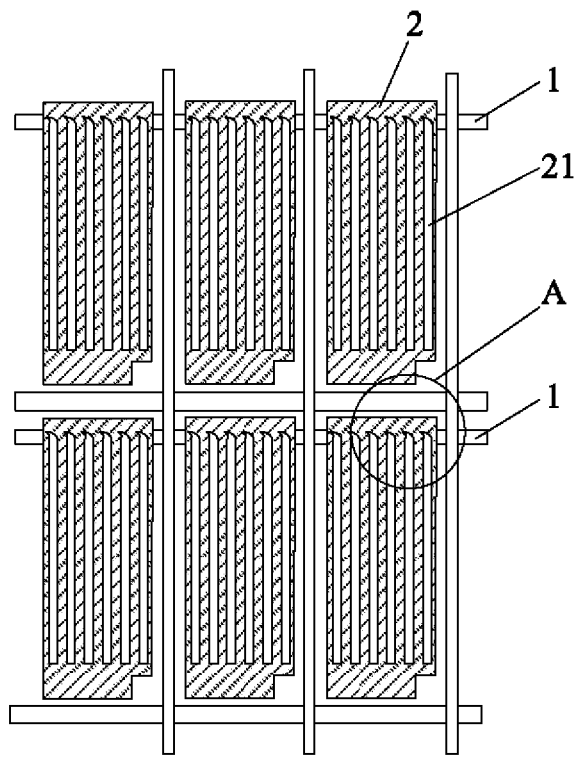
FIG. 1 is a structural schematic diagram of an array substrate in the prior art.
Figure 2:
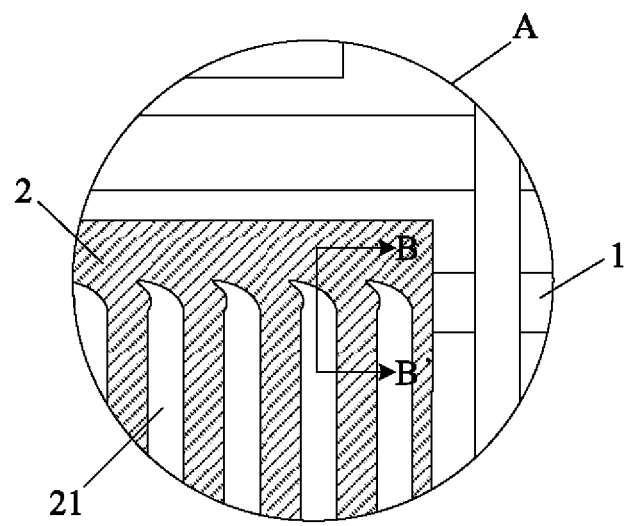
FIG. 2 is a partial amplified schematic diagram showing an area A in the array substrate of FIG. 1.
Figure 3:
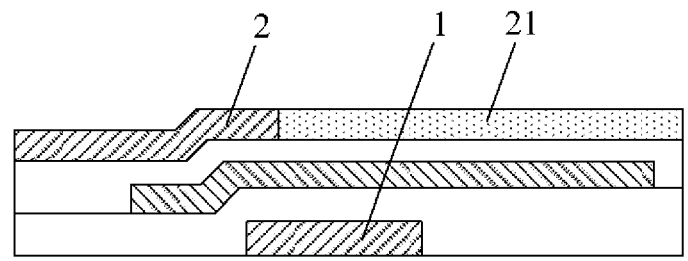
FIG. 3 is a schematic diagram showing a cross section along the line BB' in the array substrate of FIG. 2.
Figure 4:
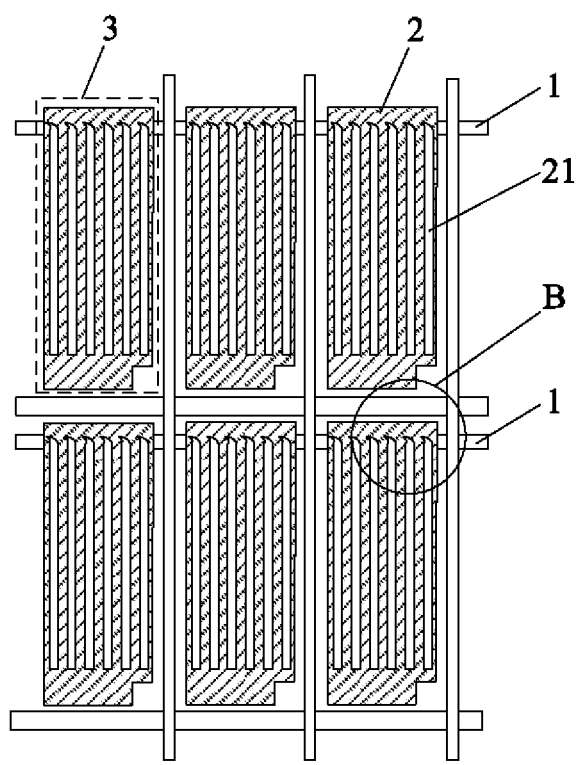
FIG. 4 is a structural schematic diagram showing an array substrate according to an embodiment of the present invention.
Figure 5:
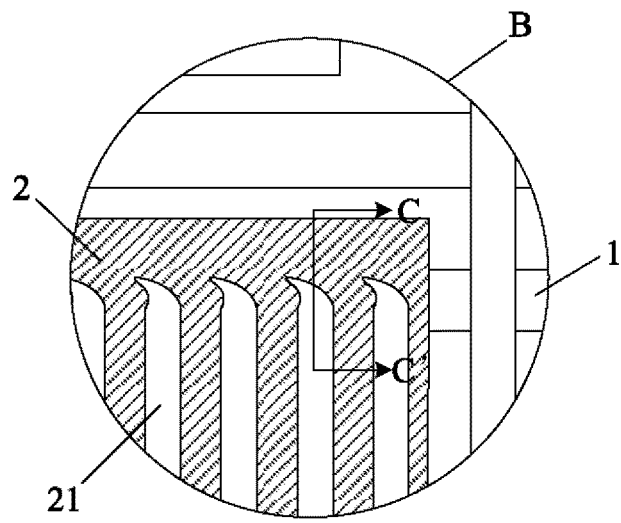
FIG. 5 is a partial amplified schematic diagram showing an area B in the array substrate of FIG. 4.
Figure 6:
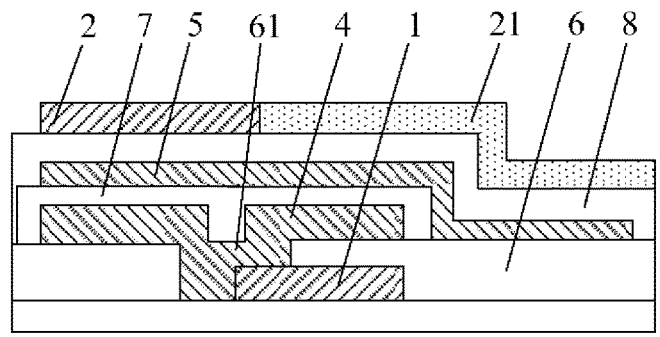
FIG. 6 is a schematic diagram showing a cross section along the line CC' in the array substrate of FIG. 4.

As shown in FIG. 4, FIG. 5 and FIG. 6, an array substrate provided by an embodiment of the present invention includes a plurality of sub-pixel units 3 defined by crossing of a plurality of gate lines and a plurality of data lines. A first electrode 2 is arranged in each sub-pixel unit 3, the first electrode 2 is a slit electrode, and a common electrode line 1 is arranged below the first electrode 2. In each sub-pixel unit 3, a light blocking layer 4 is arranged between the common electrode line 1 and the first electrode 2, and both the tail ends of slits 21 of the first electrode 2 and the common electrode line 1 are positioned in the area of the light blocking layer 4.

It should be noted that, in each sub-pixel unit 3, a second electrode 5 is also arranged between the first electrode 2 and the common electrode line 1, and the light blocking layer 4 is not limited to be arranged between the common electrode line 1 and the second electrode 5 and may also be arranged between the second electrode and the first electrode (not shown in the figure). In addition, the first electrode 2 may be a common electrode, whereas the second electrode 5 is a pixel electrode; or the first electrode 2 may be a pixel electrode, whereas the second electrode 5 is a common electrode. Moreover, the second electrode 5 may be a plate electrode or a slit electrode.

The light blocking layer is arranged in the array substrate according to the embodiment of the present invention, so that before the slit electrodes are manufactured, positions where the common electrode lines and the slit tail ends of the slit electrodes are to be located are positioned in the area of the light blocking layer, and all light is blocked in the area of the light blocking layer. Therefore, in the manufacturing process of the slit electrodes, positions nearby the slit tail ends of the slit electrodes are in a light blocking state, so that the thicknesses of photoresist therein are consistent after photoetching, patterns of the slit tail ends of the slit electrodes are consistent with predesigned patterns, and a trace mura phenomenon is avoided.

Specifically, in each sub-pixel unit 3, as shown in FIG. 6, the second electrode 5 is arranged between the first electrode 2 and the common electrode line 1; the light blocking layer 4 is arranged between the common electrode line 1 and the second electrode 5; the first electrode 2 is a common electrode, and the second electrode 5 is a pixel electrode; and the light blocking layer 4 is made of a conductive material (e.g. metal) and connected to the common electrode line 1. The storage capacitance of each sub-pixel includes capacitance formed in the superposed area of the first electrode 2 and the second electrode 5 and capacitance formed between the second electrode 5 and the light blocking layer 4. In a traditional high-resolution display device using an ADS mode, the capacitance formed between the common electrode line 1 and the second electrode 5 is relatively low, whereas in this embodiment, the light blocking layer 4 is made of the conductive material and connected to the common electrode line 1, so that the superposed area between the two electrodes is enlarged, thus the storage capacitance is improved.

Specifically, a first insulating layer 6 is arranged between the light blocking layer 4 and the common electrode line 1, wherein in the first insulating layer 6, an insulating layer through hole 61 is formed in a part of the light blocking layer 4 superposing with the common electrode line 1, and the light blocking layer 4 is connected to the common electrode line 1 via the insulating layer through hole 61. The common electrode line 1 and a gate line (not shown in the figure) are in the same layer, and the first insulating layer 6 is actually a gate insulating layer in the prior art.

Specifically, a second insulating layer 7 is arranged between the light blocking layer 4 and the second electrode 5, and the second insulating layer 7 is used for insulating between the light blocking layer 4 and the second electrode 5 and used as a capacitance medium so that capacitance is formed between the light blocking layer 4 and the second electrode 5; and a third insulating layer 8 is arranged between the second electrode 5 and the first electrode 2, and the third insulating layer 8 is an existing passivation layer and is used as a capacitor dielectric between the second electrode 5 and the first electrode 2.

The light blocking layer is arranged in the array substrate according to the embodiment of the present invention, so that before the slit electrodes are manufactured, positions where the common electrode lines and the slit tail ends of the slit electrodes are to be located are positioned in the area of the light blocking layer, and all light is blocked in the area of the light blocking layer. Therefore, in the manufacturing process of the slit electrodes, positions nearby the slit tail ends of the slit electrodes are in a light blocking state, so that the thicknesses of a photoresist therein are consistent after photoetching, patterns of the slit tail ends of the slit electrodes are consistent with predesigned patterns, and a trace mura phenomenon is avoided. Moreover, the light blocking layer made of the conductive material (e.g. metal) is connected to the common electrode lines, so that the capacitance formed between the common electrode line and the plate electrode is improved, namely the storage capacitance of the sub-pixels is improved.

According to an embodiment of the present invention, provided is a liquid crystal display device, including the above-mentioned array substrate according to the embodiment of the present invention.

The specific structure and principle of the array substrate are the same as those in the above-mentioned embodiment, and are not redundantly described herein. The liquid crystal display device specifically may be a liquid crystal panel, a liquid crystal television, a liquid crystal display, a digital photo frame, a mobile phone and the like.

In the liquid crystal display device according to the embodiment of the present invention, the light blocking layer is arranged in the array substrate, so that before the slit electrodes are manufactured, positions where the common electrode lines and the slit tail ends of the slit electrodes are to be located are positioned in the area of the light blocking layer, and all light is blocked in the area of the light blocking layer. Therefore, in the manufacturing process of the slit electrodes, positions nearby the slit tail ends of the slit electrodes are in a light blocking state, so that the thicknesses of photoresist therein are consistent after photoetching, patterns of the slit tail ends of the slit electrodes are consistent with predesigned patterns, and a trace mura phenomenon is avoided. Moreover, the light blocking layer made of the conductive material (e.g. metal) is connected to the common electrode lines, so that the capacitance formed between the common electrode line and the pixel electrodes is improved, namely the storage capacitance of the sub-pixel is improved.

Figure 7:
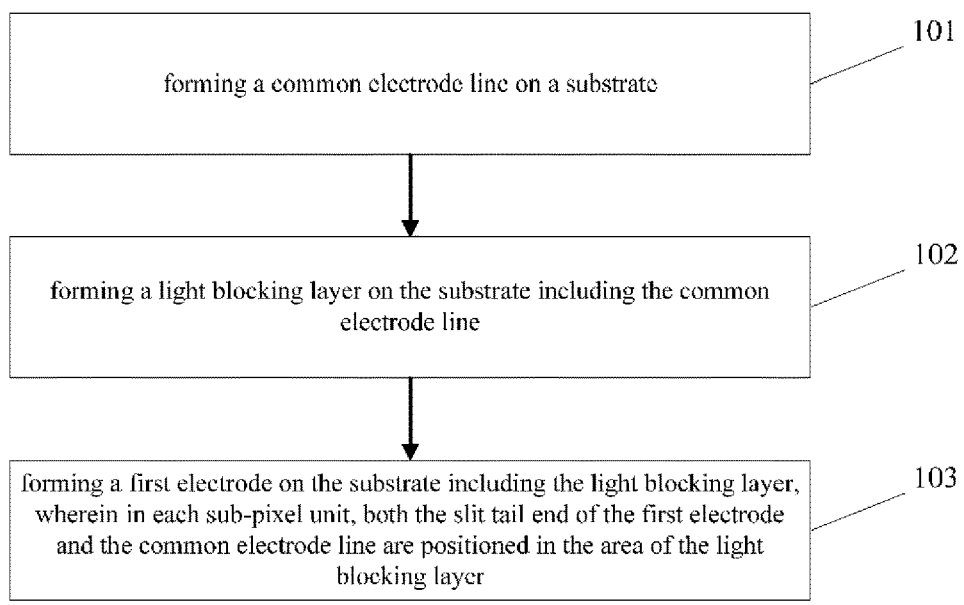
FIG. 7 is a flow diagram showing a manufacturing method of the array substrate according to an embodiment of the present invention.

FIG. 7 shows a flow diagram of a manufacturing method of the array substrate according to an embodiment of the present invention. The method includes the following steps:

step 101, as shown in FIG. 6, forming a common electrode line 1 on a substrate;

step 102, forming a light blocking layer 4 on the substrate including the common electrode line 1;

step 103, forming a first electrode 2 on the substrate including the light blocking layer 4, wherein the first electrode 2 is a slit electrode, and in each sub-pixel unit, both the tail ends of slits 21 of the first electrode 2 and the common electrode line 1 are positioned in the area of the light blocking layer 4.

The specific structure and principle of the array substrate are the same as those in the above-mentioned embodiment, and are not redundantly described herein.

The light blocking layer is arranged in the array substrate manufactured by the manufacturing method of the array substrate according to the embodiment of the present invention, so that before the slit electrodes are manufactured, positions where the common electrode lines and the slit tail ends of the slit electrodes are to be located are positioned in the area of the light blocking layer, and all light is blocked in the area of the light blocking layer. Therefore, in the manufacturing process of the slit electrodes, positions nearby the slit tail ends of the slit electrodes are in a light blocking state, so that the thicknesses of photoresist therein are consistent after photoetching, patterns of the slit tail ends of the slit electrodes are consistent with predesigned patterns, and a trace mura phenomenon is avoided.

Figure 8:
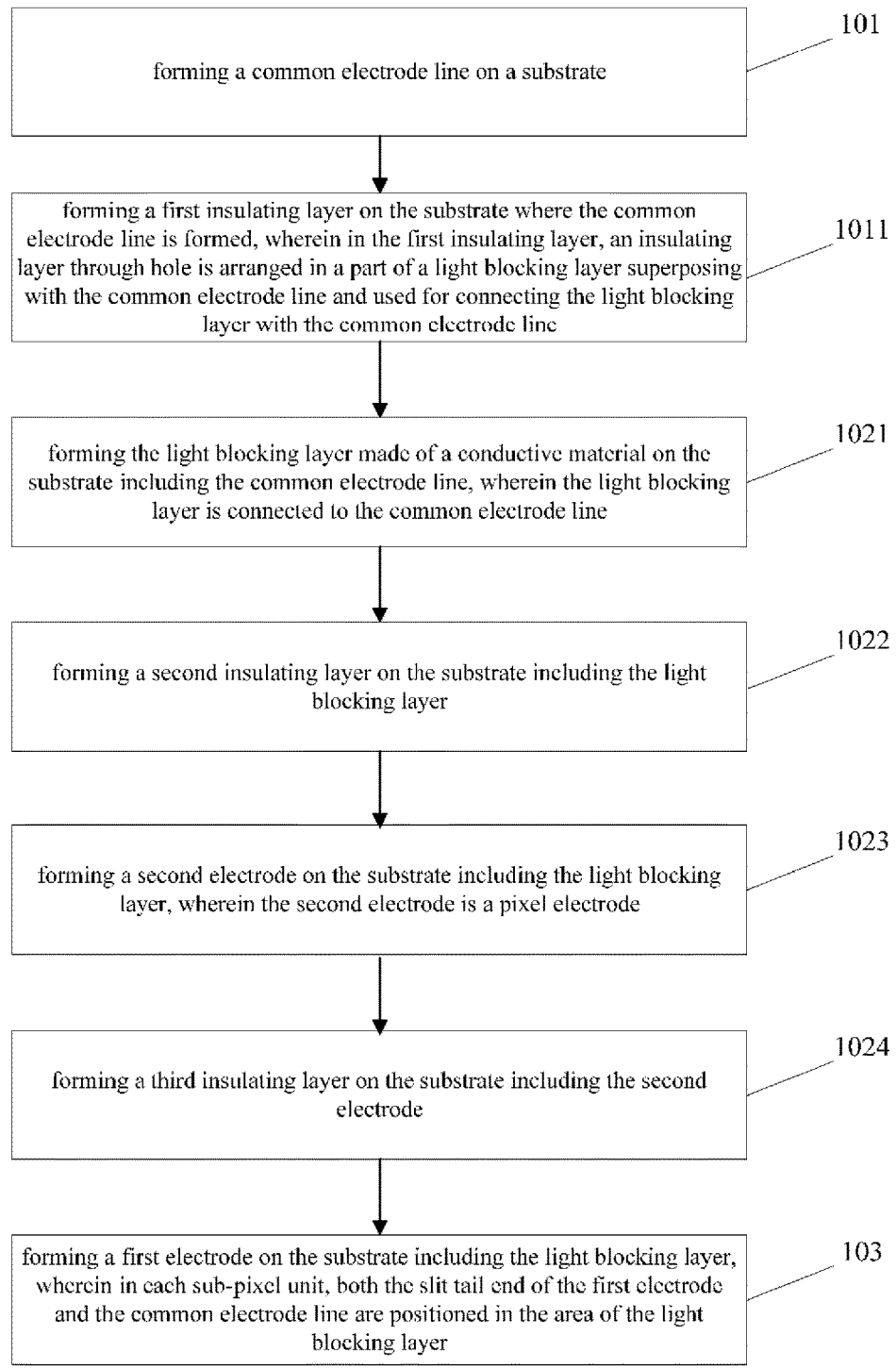
FIG. 8 is a flow diagram showing another manufacturing method of the array substrate according to an embodiment of the present invention.

Specifically, as shown in FIG. 8, the step 102 of forming the light blocking layer 4 on the substrate including the common electrode line 1 specifically includes the following step:

step 1021, as shown in FIG. 6, forming the light blocking layer 4 made of a conductive material on the substrate including the common electrode line 1, wherein the light blocking layer 4 is connected to the common electrode line 1.

Before forming the first electrode 2 on the substrate including the light blocking layer 4 in step 103, the method further includes the following step:

step 1023, forming a second electrode 5 on the substrate including the light blocking layer 4, wherein the second electrode 5 is a pixel electrode.

Before forming the light blocking layer 4 on the substrate including the common electrode line 1 in step 102, the method further includes the following step:

step 1011, forming a first insulating layer 6 on the substrate where the common electrode line is formed, wherein in the first insulating layer 6, an insulating layer through hole 61 is arranged in a part of the light blocking layer 4 superposing with the common electrode line 1 and used for connecting the light blocking layer 4 with the common electrode line 1.

Before forming the second electrode 5 on the substrate including the light blocking layer 4 in step 1023, the method further includes the following step:

step 1022, forming a second insulating layer 7 on the substrate including the light blocking layer 4.

Before forming the first electrode 2 on the substrate including the light blocking layer 4 in step 103, the method further includes the following step:

step 1024, forming a third insulating layer 8 on the substrate including the second electrode 5.

The specific structure and principle of the array substrate are the same as those in the above-mentioned embodiment, and are not redundantly described herein.

The light blocking layer is arranged in the array substrate manufactured by the manufacturing method of the array substrate according to the embodiment of the present invention, so that before the slit electrodes are manufactured, positions where the common electrode lines and the slit tail ends of the slit electrodes are to be located are positioned in the area of the light blocking layer, and all light is blocked in the area of the light blocking layer. Therefore, in the manufacturing process of the slit electrodes, positions nearby the slit tail ends of the slit electrodes are in a light blocking state, so that the thicknesses of photoresist therein are consistent after photoetching, patterns of the slit tail ends of the slit electrodes are consistent with predesigned patterns, and a trace mura phenomenon is avoided. Moreover, the light blocking layer made of the conductive material is connected to the common electrode lines, so that the capacitance formed between the common electrode line and the pixel electrode is improved, namely the storage capacitance of the sub-pixel is improved.

The foregoing descriptions are merely specific implementations of the present invention, rather than limiting the protection scope of the present invention. Any skilled one who is familiar with this art could readily think of variations or substitutions within the disclosed technical scope of the present invention, and these variations or substitutions shall fall within the protection scope of the present invention. Accordingly, the protection scope of the claims should prevail over the protection scope of the present invention.

The invention claimed is:

1. An array substrate, comprising a plurality of sub-pixel units defined by crossing of a plurality of gate lines and a plurality of data lines, wherein a first electrode and a common electrode line below the first electrode are arranged in each sub-pixel unit, the first electrode in each sub-pixel unit is a single integral electrode block having a plurality of slits enclosed by the first electrode in a plane parallel to the first electrode, wherein the plurality of slits have slit tail ends, wherein in each sub-pixel unit, a light blocking layer is arranged between the common electrode line and the first electrode, both the slit tail ends and the common electrode line are positioned in the area of the light blocking layer, orthographic projections of the common electrode line, the slit tail ends, and the light blocking layer on a plane parallel to the first electrode overlap each other, and a combination of the orthographic projections of the slit tail ends and the common electrode line on the plane is within the orthographic projection of the light blocking layer on the plane.

2. The array substrate according to claim 1, wherein in each sub-pixel unit, a second electrode is arranged between the first electrode and the common electrode line;

the light blocking layer is arranged between the common electrode line and the second electrode;

the first electrode is a common electrode, and the second electrode is a pixel electrode; and the light blocking layer is made of a conductive material and connected to the common electrode line.

3. The array substrate according to claim 2, wherein a first insulating layer is arranged between the light blocking layer and the common electrode line, wherein in the first insulating layer, an insulating layer through hole is arranged in a part of the light blocking layer superposing with the common electrode line, and the light blocking layer is connected to the common electrode line via the insulating layer through hole.

4. The array substrate according to claim 3, wherein a second insulating layer is arranged between the light blocking layer and the second electrode; and a third insulating layer is arranged between the second electrode and the first electrode.

5. A liquid crystal display device, comprising an array substrate, wherein the array substrate comprises a plurality of sub-pixel units defined by crossing of a plurality of gate lines and a plurality of data lines, a first electrode and a common electrode line below the first electrode are arranged in each sub-pixel unit, the first electrode in each sub-pixel unit is a single integral electrode block having a plurality of slits enclosed by the first electrode in a plane parallel to the first electrode, wherein the plurality of slits have slit tail ends, wherein in each sub-pixel unit, a light blocking layer is arranged between the common electrode line and the first electrode, both the slit tail ends and the common electrode line are positioned in the area of the light blocking layer, and orthographic projections of the common electrode line, the slit tail ends, and the light blocking layer on a plane parallel to the first electrode overlap each other, and a combination of the orthographic projections of the slit tail ends and the common electrode line on the plane is within the orthographic projection of the light blocking layer on the plane.

6. The liquid crystal display device according to claim 5, wherein in each sub-pixel unit, a second electrode is arranged between the first electrode and the common electrode line;

the light blocking layer is arranged between the common electrode line and the second electrode;

the first electrode is a common electrode, and the second electrode is a pixel electrode; and the light blocking layer is made of a conductive material and connected to the common electrode line.

7. The liquid crystal display device according to claim 5, wherein a first insulating layer is arranged between the light blocking layer and the common electrode line, wherein in the first insulating layer, an insulating layer through hole is arranged in a part of the light blocking layer superposing with the common electrode line, and the light blocking layer is connected to the common electrode line via the insulating layer through hole.

8. The liquid crystal display device according to claim 7, wherein a second insulating layer is arranged between the light blocking layer and the second electrode; and a third insulating layer is arranged between the second electrode and the first electrode.

9. A manufacturing method of an array substrate, comprising the following steps:

forming a common electrode line on a substrate;

forming a light blocking layer on the substrate comprising the common electrode line;

forming a first electrode on the substrate comprising the light blocking layer, wherein the first electrode is a single integral electrode block having a plurality of slits enclosed by the first electrode in a plane parallel to the first electrode, wherein the plurality of slits have slit tail ends, wherein in each sub-pixel unit, both the slit tail ends and the common electrode line are positioned in the area of the light blocking layer, orthographic projections of the common electrode line, the slit tail ends, and the light blocking layer on a plane parallel to the first electrode overlap each other, and a combination of the orthographic projections of the slit tail ends and the common electrode line on the plane is within the orthographic projection of the light blocking layer on the plane.

10. The manufacturing method of the array substrate according to claim 9, wherein the step of forming the light blocking layer on the substrate comprising the common electrode line comprises:

forming the light blocking layer made of a conductive material on the substrate comprising the common electrode line, wherein the light blocking layer is connected to the common electrode line;

before the step of forming the first electrode on the substrate comprising the light blocking layer, the method further comprises:

forming a second electrode on the substrate comprising the light blocking layer, wherein the second electrode is a pixel electrode.

11. The manufacturing method of the array substrate according to claim 10, before the step of forming the light blocking layer on the substrate comprising the common electrode line, the method further comprises:

forming a first insulating layer on the substrate where the common electrode line is formed, wherein in the first insulating layer, an insulating layer through hole is arranged in a part of the light blocking layer superposing with the common electrode line and used for connecting the light blocking layer with the common electrode line.

12. The manufacturing method of the array substrate according to claim 11, wherein before the step of forming the second electrode on the substrate comprising the light blocking layer, the method further comprises:

forming a second insulating layer on the substrate comprising the light blocking layer; and before the step of forming the first electrode on the substrate comprising the light blocking layer, the method further comprises:

forming a third insulating layer on the substrate comprising the second electrode.

* * * * *